United States Patent [19]
Berkman et al.

[11] 4,356,152
[45] Oct. 26, 1982

[54] SILICON MELTING CRUCIBLE

[75] Inventors: Samuel Berkman, Florham Park; Michael T. Duffy, Princeton Jct.; Harold E. Temple, Trenton, all of N.J.

[73] Assignee: RCA Corporation, New York, N.Y.

[21] Appl. No.: 243,441

[22] Filed: Mar. 13, 1981

[51] Int. Cl.³ .................. B01D 9/00; C30B 29/06; C30B 35/00
[52] U.S. Cl. .................. 422/248; 422/246; 422/249; 432/264; 428/408
[58] Field of Search .............. 422/248, 246, 249; 156/DIG. 83, 617 SP, 608; 432/263, 264; 428/408; 427/431

[56] References Cited
U.S. PATENT DOCUMENTS

| | | | |
|---|---|---|---|
| 3,393,054 | 7/1968 | Rupprecht et al. | 156/DIG. 83 |
| 3,491,991 | 1/1970 | Reichelt | 432/264 |
| 4,010,064 | 3/1977 | Patrick et al. | 156/DIG. 83 |
| 4,090,851 | 5/1978 | Berkman et al. | 156/DIG. 83 |
| 4,099,924 | 7/1978 | Berkman et al. | 156/DIG. 83 |
| 4,234,630 | 11/1980 | Dietl et al. | 432/264 |
| 4,242,553 | 12/1980 | Berkman et al. | 219/10.49 |

FOREIGN PATENT DOCUMENTS

| | | | |
|---|---|---|---|
| 54-157779 | 12/1979 | Japan | 156/DIG. 83 |
| 54-157781 | 12/1979 | Japan | 156/DIG. 83 |

OTHER PUBLICATIONS

Union Carbide Corporation Technical Information Bulletin No. 524-204cb, "Grafoil Ribbon-Pack".
Union Carbide Corporation Technical Information Bulletin No. 524-2031a, "Grafoil Flexible Graphite".

*Primary Examiner*—Gregory N. Clements
*Attorney, Agent, or Firm*—Birgit E. Morris; R. Hain Swope

[57] ABSTRACT

An improved liner for crucibles and dies used to melt silicon comprising one or more sheets of graphite each of which has on at least the surface facing the silicon melt a layer of silicon nitride or silicon oxynitride.

11 Claims, 3 Drawing Figures

SILICON MELTING CRUCIBLE

This invention relates to an improvement in a crucible for melting silicon and forming ingots, single crystal sheets and the like, therefrom.

BACKGROUND OF THE INVENTION

Apparatus for forming silicon melts have been known for many years and numerous variations in basic crucible design have been developed. Among these are variations in crucible design to include means to produce a substantially single crystalline form of silicon.

A major problem inherent in the casting or forming of silicon is that molten silicon is extremely reactive. Molten silicon will attack or corrode the walls of the crucible and/or die. If these materials become wetted by the silicon which will adhere thereto, both the apparatus and silicon product may crack upon cooling of the melt due to the difference in their thermal coefficients of expansion. In addition, molten silicon may become undesirably contaminated by contact with practically all of the die and crucible materials that have been employed to date. Since silicon must have high purity from contaminants for certain applications, such as use in solar panels, the problem of contamination is of major concern.

A number of solutions have been proposed for these problems. For example, U.S. Pat. Nos. 4,090,851 and 4,099,924 teach directly coating those crucible and/or die surfaces which contact the melt with a substantially non-porous layer of pyrolitic silicon nitride and silicon oxynitride, respectively. As the molten silicon cools, it will adhere to those coatings and, as a consequence, to the crucible surfaces. This is disadvantageous because the difference in the thermal coefficients of expansion of the silicon and the crucible surfaces will often cause cracking of the silicon ingot during cooling. In addition, since any point of contact between the melt and the crucible surface may act as a "wick" for impurities to flow outwardly from the crucible surface and contaminate the melt, the use of these coatings requires that crucible surfaces be of relatively high purity. The requirement of relatively high purity for such material is an expensive disadvantage since adherence of the melt to the crucible requires that the crucible be sacrificed after but a single use.

In accordance with this invention, a means is provided whereby the above-mentioned disadvantages of previous methods and apparatus are overcome.

SUMMARY OF THE INVENTION

According to this invention, a lining is provided on the surfaces of crucible apparatus for forming a silicon melt which prevents contact between the melt and the crucible walls, preserves the crucible walls and prevents the flow of undesirable contaminants from the walls into the melt.

DETAILED DESCRIPTION OF THE INVENTION

The present invention is applicable to crucible and/or die apparatus of any particular design or configuration. It is likewise applicable to apparatus intended to form any particular desired product from the molten silicon, such as ingots, substantially single crystal or polycrystal silicon sheets, and other forms having a variety of applications.

In accordance with the present invention, there is provided a protective liner for conventional apparatus for forming a melt of silicon which possesses significant advantages over similar protective means known heretofore. The protective liner, according to this invention, comprises one or more thin flexible sheets of graphite having on at least the surface facing the melt a layer of silicon nitride or silicon oxynitride, with silicon nitride being preferred.

Figure 1:
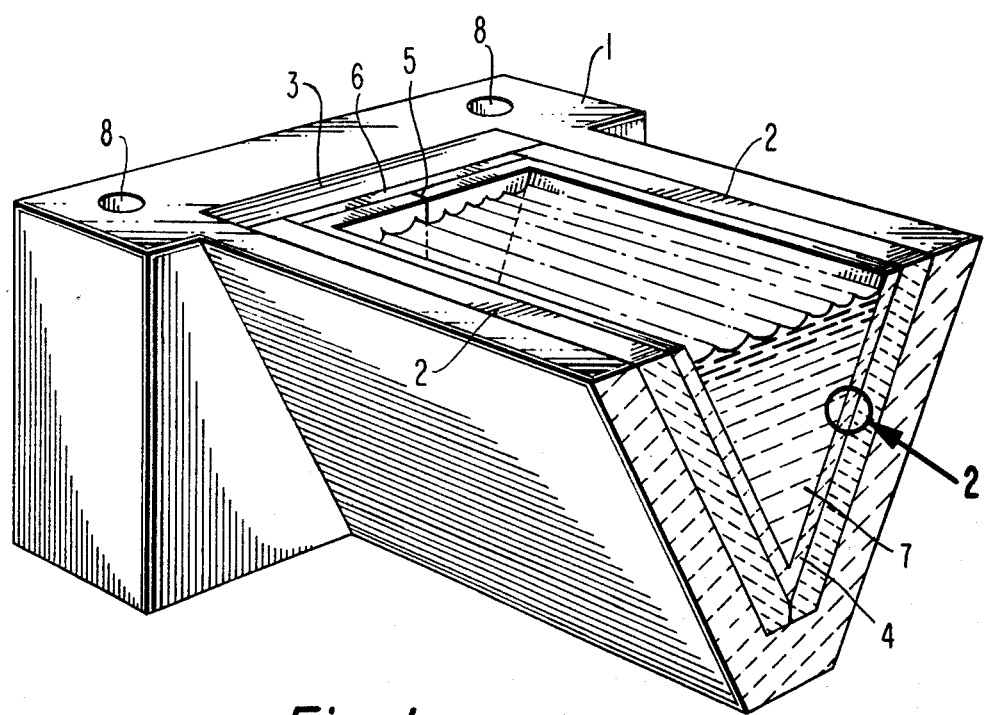
FIG. 1 is an isometric projection of a conventional crucible apparatus for melting silicon having a protective liner according to this invention.

FIG. 1 illustrates the basic construction of a conventional crucible apparatus for melting silicon. This apparatus is comprised of a susceptor 1 comprised of a refractory material such as graphite. The susceptor 1 is mountable on a flat surface by bolts, not shown, which extend through mounting holes 8. The susceptor contains crucible plates 2 and 3 which are comprised of a material substantially non-wettable by molten silicon such as, for example, mullite.

Figure 2:
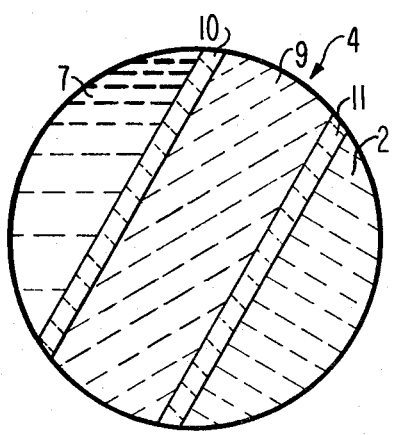
FIG. 2 is an enlargement of the section of FIG. 1 as indicated by the circle and arrow 2 on FIG. 1.

The side crucible plates 2 are covered on their internal surfaces by a single sheet 4 of the liner of this invention which is in direct contact with molten silicon 7. The liner 4 is folded to conform to the V shape of the crucible. The liner 4 is likewise cut and folded at the ends to conform to the shape of end crucible plate 3. The ends of liner 4 abut at line 5. A second sheet of liner 6, also cut to conform to end plate 3, is inserted between the folded ends of liner 4 and end plate 3. In an alternate embodiment, not shown, the sheet of liner 6 may be inserted between the folded ends of sheet 4 and molten silicon 7. As illustrated in FIG. 2, the liner 4 of this invention is in contact with crucible plate 2 and is comprised of a graphite sheet 9 having at least a layer 10 of silicon nitride or silicon oxynitride on the surface facing the molten silicon 7. In the preferred embodiment illustrated in FIG. 2, the liner 4 also has a second layer of silicon nitride or oxynitride 11 on the surface of graphite sheet 9 facing crucible plate 2.

Figure 3:
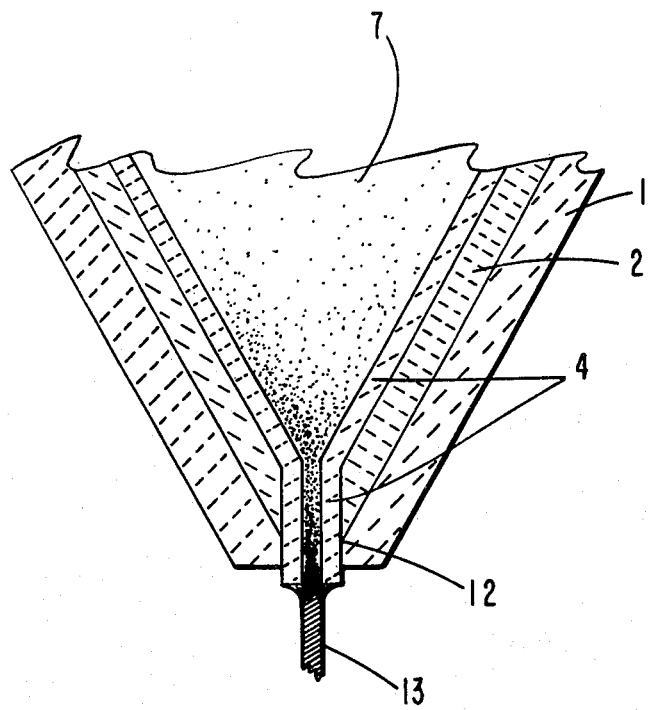
FIG. 3 is a cross-sectional view of a conventional crucible apparatus for melting silicon having shaping die means wherein both the crucible and die means have a protective liner according to this invention.

A cross-sectional view of a conventional crucible having shaping die means is illustrated in FIG. 3. The cross-sectional view in FIG. 3 is drawn at any portion of the crucible having the die means as the die means conventionally does not extend throughout the length of the crucible. In the apparatus illustrated in FIG. 3, the crucible in its lowermost edge is provided with an elongated slot defining a die 12. The liner 4 is cut and folded so that it extends through the die 12 thus protecting crucible plate 2 and susceptor 1. Since such dies are well known to those of ordinary skill in the art, a more detailed description of the die 12 is omitted in the interest of brevity. The die provides a discharge of the melt from the crucible which solidifies into a ribbon-shaped crystal 13 which is pulled downwardly from the melt.

The unique liner of this invention prevents damage to the crucible walls as well as substantially eliminating contamination of the silicon melt by impurities from the crucible walls. It is recognized that it is almost impossible to prevent microcracks in a given coating, especially a thin coating. When molten silicon penetrates the inevitable microcracks in the layer of silicon nitride or silicon oxynitride, formation of solid silicon carbide takes place. In the instance of smaller microholes in the silicon nitride or oxynitride layer, the formation of silicon carbide effectively acts as a sealant. In the instance of larger microcracks or holes, the formation of silicon carbide retards both the penetration of molten silicon into the graphite sheet and diffusion of impurities from the crucible wall into the melt.

While molten silicon is a solvent for silicon carbide, the usual size of the openings that might be formed in the silicon nitride or oxynitride layer in the liners of this invention is such that the flow of molten silicon therethrough is insufficient to have an appreciable quantity of molten silicon completely penetrate the graphite sheet and contact the crucible walls. In order to minimize the possibility that the molten silicon will penetrate to the walls of the crucible and/or die, the graphite liner, in accordance with this invention, wherein it is comprised of a single sheet of graphite, will preferably have a layer of silicon nitride or oxynitride on both surfaces. It is preferred in accordance with this invention however, to use two or more such graphite sheets, some or all of which may have a layer of silicon nitride or oxynitride on only one surface. In all instances, however, each flexible graphite sheet has a layer or coating of silicon nitride or oxynitride on the surface facing the melt. The presence of this layer prevents the molten silicon from dissolving the graphite and prevents the flow of impurities from the crucible walls into the melt as well.

The protective lining of the present invention is highly advantageous in a number of regards. First, due to the "self-sealing" action of silicon carbide, the layer of silicon nitride or oxynitride does not have to be a totally impervious layer. While major defects are obviously not acceptable, the layer does not have to rise to the level described in the aforementioned U.S. patents. This realizes a potential savings in terms of manufacture of the coated graphite sheets.

Second, the lining of the present invention is clearly advantageous over previous coatings on the mold surface itself since it is substantially less expensive than the crucible walls. It is contemplated in accordance with this invention that the lining be replaced and discarded after each run thereby preserving the integrity of the crucible walls.

Most important, the protective lining of this invention, due to its capacity to prevent impurities flowing into the melt from the crucible walls, permits the use of relatively inexpensive, readily available materials for forming the crucible and/or die assembly which heretofore were considered unacceptable because of substantial potential for contamination of the melt. The savings in utilizing such materials for forming the crucible are significant.

The crucible and shaping dies, if such are present, may be formed of practically any inert, shapeable, high temperature refractory substance which meets the basic conventionally recognized requirements of mechanical strength and the like. Such substances conventionally include, for example fused silica, i.e. quartz, boron nitride, ceramic-bonded and/or sintered silicon nitride compositions such as those bonded with magnesium and aluminum oxides, and the like. It is essential that the material used to form the crucible and shaping dies be non-wettable by molten silicon to the greatest degree possible. Materials possessing this property, as well as the other requisite properties, are well known to those skilled in the art.

As stated above, the improved linings of this invention make possible the fabrication of crucible and/or die assemblies from inexpensive, non-wettable materials heretofore unacceptable because of a high content of impurities which would materially contaminate the silicon melt if contacted therewith. A particularly preferred material of this type is mullite, which is a homogeneous solution of alumina in sillimanite, i.e. aluminum oxide in silicon oxide. Aside from the high potential for contamination of the melt therewith, this material is highly advantageous for fabrication of crucible and die assemblies as it is inexpensive and has a coefficient of expansion very close to that of silicon. This latter property is very important as no material is totally non-wettable by molten silicon. If the walls of the crucible and/or the die accidentally become wettable by the molten silicon, the silicon ingot may be detached from the crucible wall without breaking or cracking either if they have very close coefficients of thermal expansion.

The graphite utilized to form the sheets which are utilized in the liners of this invention is preferably pure graphite containing no conventional additives. A preferred material is flexible sheets of pure graphite marketed under the trademark "Grafoil" by Union Carbide Corporation. Generally, such sheets are supplied in thicknesses of 5 or 10 mils. Sheets as thin as 2 mils may be utilized in the practice of this invention, with 3 mil sheets being preferred. As a practical matter, the thickness of an individual sheet of graphite should not be in excess of about 12 mils.

The layer of silicon nitride or silicon oxynitride on the sheets of graphite is likewise thin. Generally, layers of from about 1/20 mil to about 1 mil, preferably from about 1/20 mil to about ½ mil, are utilized. These layers can be on one or, preferably, both sides of the graphite sheet. While any of the conventional methodologies for applying a thin coating to a substrate may be utilized in forming the protective liners of this invention, chemical vapor deposition (CVD) techniques such as are described in U.S. Pat. Nos. 4,090,851 and 4,099,942 are preferred. Such procedures generally involve passing mixtures of suitable reactant gases or vapors, usually dispersed in a carrier gas, over the substrate, i.e. the graphite sheet, while heating the substrate to a temperature between about 700° C. and about 1500° C.

Generally, the protective liner of this invention should have a minimum thickness of about 3 mils. While the maximum total thickness of the liner is not particularly critical within practical limits, the effectiveness thereof is not significantly increased when total thickness is increased substantially above 12 mils. It will be appreciated that variation in the number and thickness of the graphite sheets, the thickness of the layers, and whether the layers are on one or both surfaces of the sheets lead to numerous possible combinations of sheets and layers within the desired thickness range. It will likewise be appreciated that the minimum and maximum thicknesses given above are for each liner and do not apply to the situation where one of two abutting sheets of liner overlaps the other to prevent leakage at their juncture.

While the total thickness of the protective liner of this invention can be a single graphite sheet with one or two layers of silicon nitride or oxynitride, generally two more more graphite sheets are preferred. A preferred liner in accordance with this invention is comprised of two graphite sheets each 3 mils thick having at least 2, and preferably 4, layers of silicon nitride or oxynitride making a total thickness of between about 6 and 7 mils. It is also preferred in accordance with this invention that thinner graphite sheets, i.e. sheets having a thickness of 2 or 3 mils, have layers of silicon nitride or silicon oxynitride on both surfaces. It is within the scope of this invention that the thickness of individual graphite sheets and/or the thickness and the number of layers of silicon nitride or silicon oxynitride on each may vary within any given liner.

In practice, sheets of the improved liner of this invention are cut to the configuration of the crucible plates and/or die assembly which they are to protect. Since the sheets of the liner of this invention are flexible, they may be cut and/or folded after the silicon nitride or oxynitride layer has been applied to the graphite sheet without adverse effect. The cut pieces are then placed on the interior surfaces of the plates either before or after assembly into the crucible. Since it is contemplated that the liner be discarded after each use of the crucible, the liner is not attached to any of the surfaces to be protected. It is further neither necessary nor contemplated that abutting sheets of liner be joined in any way, as by bonding.

The liner of this invention is cut to the configuration of crucible and/or die components with customary machining tolerances. Since the liner of this invention is flexible, a single sheet may be folded to cover two crucible plates which abut at an angle, as shown in FIG. 1. Further, it is preferred that one of two abutting sheets of liner extend beyond their juncture point and be folded to substantially overlap the other. Wherein the liner of this invention is comprised of more than one sheet of graphite having a layer of silicon nitride or oxynitride on at least one surface, from one up to all of the individual graphite sheets may be folded to overlap an abutting second sheet of liner.

The overlapping of liner sheets acts to prevent any flow of molten silicon between abutting sheets of liner. Any minute gaps which might occur between abutting sheets of liner are, in effect, equivalent to cracks in the layer of silicon nitride or silicon oxynitride on the liners themselves, e.g. in terms of the "self sealing" action of silicon carbide. Further, because the crucible plates and die structure are non-wetting to molten silicon, there are no capillary flow forces which would enhance the flow of molten silicon between abutting liner sheets.

The crucible may be of any desired design consistent with forming silicon ingots having a particular configuration. Wherein the crucible incorporates shaping dies, these may be of any desired design in accordance with the ribbon growing procedure being utilized and the configuration of the product being made. Generally, the dies should have a length at least as great as the width of the ribbon being pulled therethrough from the silicon melt. The silicon melt is frequently produced by heating a solid silicon bar or a particulate form of feed which may be substantially monocrystalline or polycrystalline. Any of the conventional dopants may be incorporated into the silicon.

The silicon melt may be formed by any suitable heating means such as an R.F. (radio frequency) coil outside the crucible. Other conventional heating means may be utilized as well. External heating of the melt by conduction is very fuel inefficient, however, because the walls of the crucible must be heated to a higher temperature than the melt. It is preferred, therefore, to have the source of heat coupled directly to the melt as disclosed in Berkman et al U.S. Pat. No. 4,242,553, issued Dec. 30, 1980, since this allows for the refractory walls of the crucible to function as an insulator. Ingots or ribbon products of silicon prepared on conventional apparatus equipped with the unique protective liner of this invention have been found to be substantially free from deleterious impurities which often find their way into such products manufactured in conventional equipment not so protected.

We claim:

1. In a crucible for forming a silicon melt, the improvement comprising providing on all internal surfaces of said crucible which might contact the molten silicon a protective lining comprising one or more thin, flexible sheets of graphite each of which has on at least the surface facing the molten silicon a layer of silicon nitride or silicon oxynitride and at least one of which has said layer on both surfaces.

2. The improved crucible in accordance with claim 1, wherein each of said sheets of graphite has a thickness of from about 2 mils to about 12 mils.

3. The improved crucible in accordance with claim 2, wherein each of said sheets of graphite has a thickness of about 3 mils.

4. The improved crucible in accordance with claim 1, wherein said layer is from about 1/20 mil to about 1 mil thick.

5. The improved crucible in accordance with claim 4, wherein said layer is from about 1/20 mil to about ½ mil thick.

6. The improved crucible in accordance with claim 1, wherein said lining is comprised of 2 sheets of graphite at least one of which has said layer on both surfaces.

7. The improved crucible in accordance with claim 1, wherein said lining has a total thickness of from about 3 mils to about 12 mils.

8. The improved crucible in accordance with claim 7, wherein said lining has a total thickness of from about 6 mils to about 7 mils.

9. The improved crucible in accordance with claim 1, wherein said crucible additionally includes die means for growing silicon in sheet or ribbon form, the internal surfaces of said die means also being provided with said protective lining.

10. The improved crucible in accordance with claim 1, wherein the improvement additionally comprises forming said crucible of mullite.

11. The improved crucible in accordance with claim 9, wherein the improvement additionally comprises forming said die means and said crucible of mullite.

* * * * *